United States Patent
Pizzetti et al.

(10) Patent No.: US 11,075,073 B2
(45) Date of Patent: Jul. 27, 2021

(54) CLEANING CHEMICAL COMPOSITION FOR THE REMOVAL OF AN AMORPHOUS PASSIVATION LAYER AT THE SURFACE OF CRYSTALLINE MATERIALS

(71) Applicant: Technic France, Saint Denis (FR)

(72) Inventors: Christian Pizzetti, La Batie Divisin (FR); Marine Audouin, Grenoble (FR); Jérôme Daviot, Chatenoy le Royal (FR); Nicolas Pialot, Paris (FR); Philippe Vernin, Paris (FR)

(73) Assignee: Technic France

(*) Notice: Subject to any disclaimer, the term of this patent is extended or adjusted under 35 U.S.C. 154(b) by 0 days.

(21) Appl. No.: 16/616,089

(22) PCT Filed: Jun. 29, 2018

(86) PCT No.: PCT/FR2018/051607
§ 371 (c)(1),
(2) Date: Nov. 22, 2019

(87) PCT Pub. No.: WO2019/002789
PCT Pub. Date: Jan. 3, 2019

(65) Prior Publication Data
US 2020/0335326 A1    Oct. 22, 2020

(30) Foreign Application Priority Data
Jun. 30, 2017    (FR) .......................... 1756215

(51) Int. Cl.
*C11D 11/00* (2006.01)
*H01L 21/02* (2006.01)

(52) U.S. Cl.
CPC .... *H01L 21/02063* (2013.01); *C11D 11/0047* (2013.01)

(58) Field of Classification Search
CPC ......... H01L 21/02063; H01L 21/02052; H01L 21/02057; C11D 11/0047; C11D 3/042; C11D 3/2079
See application file for complete search history.

(56) References Cited

U.S. PATENT DOCUMENTS

| | | | |
|---|---|---|---|
| 9,058,976 B2* | 6/2015 | Chhabra | C11D 3/2079 |
| 2005/0143270 A1* | 6/2005 | Wojtczak | C11D 7/36 |
| | | | 510/175 |
| 2006/0228890 A1 | 10/2006 | Lee et al. | |
| 2010/0048443 A1 | 2/2010 | Ohwada | |
| 2012/0129345 A1* | 5/2012 | Lee | C11D 3/042 |
| | | | 438/692 |
| 2013/0146102 A1* | 6/2013 | Monsrud | C11D 11/0023 |
| | | | 134/28 |

(Continued)

FOREIGN PATENT DOCUMENTS

JP    S6064437 A    4/1985

OTHER PUBLICATIONS

International Search Report from Application No. PCT/FR2018/051607 dated Oct. 11, 2018, 2 pages.

*Primary Examiner* — John R Hardee
(74) *Attorney, Agent, or Firm* — Lerner, David, Littenberg, Krumholz & Mentlik, LLP

(57) ABSTRACT

A cleaning chemical composition suitable, for removing a passivation layer from a substrate, wherein the passivation layer comprises residues resulting from etching of said Substrate.

13 Claims, 8 Drawing Sheets

(56) References Cited

U.S. PATENT DOCUMENTS

| | | | |
|---|---|---|---|
| 2014/0128307 A1* | 5/2014 | Chhabra | C11D 7/08 |
| | | | 510/175 |
| 2016/0163533 A1 | 6/2016 | Dobashi et al. | |
| 2019/0177680 A1* | 6/2019 | Ansari | C12M 25/14 |
| 2019/0194580 A1* | 6/2019 | Kamimura | C11D 7/261 |

* cited by examiner

US 11,075,073 B2

CLEANING CHEMICAL COMPOSITION FOR THE REMOVAL OF AN AMORPHOUS PASSIVATION LAYER AT THE SURFACE OF CRYSTALLINE MATERIALS

CROSS-REFERENCE TO RELATED APPLICATIONS

The present application is a national phase entry under 35 U.S.C § 371 of International Application No. PCT/FR2018/051607 filed Jun. 29, 2018, which claims priority from French Application No. 1756215 filed Jun. 30, 2017, all of which are hereby incorporated herein by reference.

FIELD OF THE INVENTION

This invention relates to a cleaning chemical composition which dissolves an amorphous surface layer composed of metals or semiconductor materials in their oxidised form in order to allow them to be removed selectively in relation to layers comprised of other materials which may be exposed to said composition. The composition in question is particularly suitable for removing an amorphous passivation layer resulting from the implementation of a plasma etching method, very frequently used in microelectronics.

STATE OF THE PRIOR ART

The implementation of a dry-path etching method involves exposing a layer of a defined material, for example a layer of a metal, to an ion plasma in order to etch said layer, that is, to attack certain predetermined zones of said layer so as to allow local removal of material at these zones. Three principal types of dry etching exist, namely Ion Beam Etching (acronym IBE), Reactive Ion Etching (acronym RIE), and etching by gaseous chemical attack. All three result from the formation of an ion plasma. During the process, gases in a plasma state convert the material to be etched from the solid state to the gas state to enable it to be eliminated, that is, removed from the layer of material to be etched.

Plasma etching is in particular, but not exclusively, used in the context of the manufacture of microelectronic devices, where the manufacture of integrated circuits requires successive deposition and etching steps on the various layers in order to create elementary devices and to connect them together. Such electronic devices are, in particular, Metal Oxide Semiconductor (MOS) transistors, formed from an oxide layer arranged between a layer of metal and a layer of a semiconductor material, or Metal-Insulator-Metal (MIM) capacitors formed from a layer of insulator arranged between two layers of conductive materials. For technological reasons the value of the dielectric constant of the insulator must be as high as possible. Materials such as tantalum pentoxide ($Ta_2O_5$), hafnium dioxide ($HfO_2$) and zirconium dioxide ($ZrO_2$) in their crystalline forms are used for the formation of these capacitors, and are known as "high-k materials".

Carrying out plasma etching results in the formation of etching residues which are primarily deposited on the lateral walls, or flanks, of the etched layer. These etching residues take the form of an amorphous surface layer composed of metals or of semiconductor materials in their oxidised form, which result from the interaction of the plasma ions with the layer or layers to be etched.

The etching residues may be deposited for example on the internal lateral surface of an etching "well", or on the external lateral surfaces of a pattern, where the latter corresponds to a non-etched zone located on either side of etched zones. They thus form a passivation layer which provides a barrier to plasma etching.

The passivation layer is either formed by the re-deposition of etching products with low volatility, or by the introduction into the plasma of a polymerising gas which is capable of forming etching residues. Several physico-chemical mechanisms for the formation of a passivation layer can be distinguished, amongst which are the following recurrent mechanisms.

According to a first mechanism, the plasma ions react with the layer to be etched and form a reactive layer on the surface to be etched on the flanks of the patterns. According to a second mechanism, the volatile etching products from the reaction of the plasma ions with the layer to be etched are deposited on the flanks of the pattern, then react with the chemical environment in order to form the passivation layer, for example by oxidation. According to a third mechanism, the residues are produced directly by the plasma and are deposited directly on the flanks of the patterns, without the reactive layer being involved.

Moreover, plasma etching has the advantage of being relatively anisotropic, with the majority of etching being directed along the flow of plasma ions, that is, in a direction which is substantially perpendicular to the layer of the substrate to be etched.

Nevertheless, although etching anisotropy results from the directional flow of ions, there is a non-negligible lateral etching rate due to isotropic etching mechanisms of a chemical nature.

The lateral etching rate is the resultant of two components: horizontal etching of the flanks of the substrate and the formation of the protective passivation layer on the flanks. Consequently, by controlling the formation of the passivation layer, it is possible to maximise etching in the direction of the plasma ion flow and to minimise lateral etching which is substantially perpendicular to the direction of the plasma ion flow. In practice the plasma etching method is optimised so as to form a passivation layer whose depth is low and controlled, on the flanks of the substrate.

In all cases, whether controlled or not, the passivation layer results from the very action of the plasma on the layer to be etched, and needs to be eliminated after etching.

In order to do this, the use of wet path chemical cleaning is known, wherein a chemical composition is applied in contact with the etching residues so that they are chemically attacked and removed from the substrate. This type of cleaning is very widely used, in particular because it is relatively easy to implement. In practice it involves ensuring the chemical composition comes into contact with the substrate for a sufficient time to allow the passivation layer to be removed from the substrate, where this cleaning time depends on the nature and on the thickness of the layer to be removed and on the chemical composition. It may involve, for example, soaking the substrate in a bath of the chemical composition, or dispensing the composition dynamically onto the substrate as it rotates on a suitable support. Consequently it is possible to process many substrates in parallel. This represents a considerable time saving and a significant reduction in industrial production costs.

The chemical composition is chosen depending on the constituent material of the passivation layer to be removed, and on the materials of the layers to be protected and which must not be attacked by the composition. When the passivation layer is obtained by re-deposition of low-volatility etching products (which is the case in particular for the first and second mechanisms above), the choice of chemical composition will therefore also depend on the constituent material of the etched layer.

Thus it is necessary to use a chemical composition which effectively attacks the etching residues, whilst being selective in relation to other materials with which it may come into contact during cleaning.

The use of hydrofluoric acid for chemical cleaning of the substrate after plasma etching is known. More generally, hydrofluoric acid is widely used for wet etching of metallic oxides and semiconductors, and dissolves metal oxides and amorphous semiconductors highly effectively. It should be stated that an amorphous structure corresponds to a disorganised atomic structure, as opposed to a crystalline structure which is ordered according to a crystalline lattice. The crystalline lattice confers rigidity on the structure and makes it much more resistant to chemical attack than the amorphous structure and in particular to hydrofluoric acid.

It has also been observed that compositions comprising hydrofluoric acid and acetic acid attack amorphous metallic oxides much more effectively than a composition of hydrofluoric acid alone. On this subject, document US 2016/0163533 states that a composition based on hydrofluoric acid, an organic acid such as acetic acid and water allows a layer of tantalum oxides on a silicon substrate to be effectively attacked, without attacking the silicon.

The above chemical compositions are effective at attacking amorphous metallic oxides, whilst exhibiting selectivity in relation to certain metals or semiconductor materials such as, for example, silicon.

None of these compositions, however, protect aluminium, so that a layer of aluminium coming into contact with the chemical composition is attacked and removed with the amorphous metallic oxide layer.

DESCRIPTION OF THE INVENTION

The aim of the invention, therefore, is to overcome the drawbacks of the prior art by proposing a cleaning chemical composition which allows a passivation layer to be removed selectively in relation to aluminium and copper. In other words, the proposed chemical composition attacks the passivation layer whilst protecting the aluminium and the copper.

The aim of the invention in particular is to propose a chemical composition for cleaning a substrate formed of a layer or a stack of layers after plasma etching of one or more of its constituent layers, where the composition allows a passivation layer, formed by the interaction of the plasma ions with the layer or layers of substrate to be etched, to be removed selectively in relation to aluminium and copper.

To this end, according to a first aspect, the invention proposes a cleaning chemical composition that is suitable for removing, from a substrate, a passivation layer which comprises etching residues resulting from etching of said substrate, principally characterised in that it comprises:
  a weak acid comprising acetic acid, the weak acid content being between 20% by weight and 95% by weight, preferably between 50% by weight and 80% by weight, relative to the weight of the chemical composition,
  a non-oxidising strong acid comprising methanesulphonic acid, the non-oxidising strong acid content being between 5% by weight and 50% by weight, preferably between 15% by weight and 50%, relative to the weight of the chemical composition,
  hydrofluoric acid, whose content is between 0.2% by weight and 2% by weight relative to the weight of the chemical composition,
  water, whose content is between 2% by weight and 20% by weight relative to the weight of the chemical composition.

According to one embodiment, the chemical composition is constituted solely, or essentially, of the weak acid, the strong acid, hydrofluoric acid and water.

According to one embodiment the strong acid moreover comprises hydrochloric acid:

Another aim of the invention is to propose a method of cleaning a substrate which allows removal of a passivation layer which is selective in relation to aluminium and copper, wherein the chemical composition described above is used.

To this end, according to a second aspect, the invention proposes a cleaning method for removing, from a substrate, a passivation layer which comprises etching residues resulting from etching of said substrate, principally characterised in that it comprises the following steps:
  providing a cleaning chemical composition in accordance with the above composition,
  bringing the cleaning chemical composition into contact with the passivation layer for a time that is sufficient to remove said passivation layer from the substrate.

According to other aspects, the proposed cleaning method exhibits the following different characteristics taken alone or according to combinations of these which are technically possible:
  the cleaning chemical composition used is manufactured from methanesulphonic acid which has a concentration of between 60% by weight and 80% by weight;
  the cleaning chemical composition used is manufactured from hydrochloric acid which has a concentration of between 30% by weight and 40% by weight;
  prior to the contact period step, a step for plasma etching of a layer or of a stack of layers of a substrate, from which the passivation layer results by the interaction of plasma ions with the layer or at least one of the layers of the stack of layers of the substrate;
  during the contact period with the passivation layer, the chemical composition is at a temperature of between 20° C. and 40° C., preferably between 20° C. and 30° C.;
  the passivation layer comprises one or more of the following chemical elements: Tantalum, hafnium, zirconium;
  the constituent materials of the layer of the substrate to be etched or of the stack of layers of the substrate to be etched are chosen from one or more of the following materials: metals, metallic oxides, semiconductor materials, oxides of semiconductor materials;
  the constituent materials of the layer of the substrate to be etched or of the stack of layers of the substrate to be etched comprise aluminium and/or copper.

The proposed chemical composition and the cleaning method apply in particular, but not exclusively, to the removal of a passivation layer in the context of microelectronic component manufacture.

The term "passivation layer" in the present description refers to an amorphous layer formed naturally or artificially (in the case of residues obtained after plasma etching, for example), constituted of metals and/or semiconductor materials in their oxidised form (with an oxidation number greater than or equal to 1), and which may comprise several chemical elements associated with the cation(s) of the metal and/or the semiconductor material, such as fluorine, chlorine, phosphorous, sulphur, oxygen, nitrogen or carbon.

The substrate is formed of a layer or of a stack of layers constituted of at least two different materials. The constituent materials of the substrate layers are metals and semiconductor materials and these may be present in their oxidised form (with an oxidation number greater than or equal to 1). These may be insulating materials, such as high dielectric constant, so-called "high-k", materials, such as tantalum pentoxide ($Ta_2O_5$), hafnium dioxide ($HfO_2$) and zirconium dioxide ($ZrO_2$), in their crystalline form. One or more of the constituent layers of the substrate are plasma etched (and are hereafter designated as "etched layers of the substrate") then the etched substrate is cleaned with the composition of the invention in order to remove the passivation layer which covers the flanks of the etched layer.

DESCRIPTION OF THE FIGURES

Other advantages and characteristics of the invention will become apparent on reading the following description given as an illustration, and not restrictively, with reference to the appended figures which show.

DETAILED DESCRIPTION OF THE EMBODIMENTS OF THE INVENTION

Figure 1:
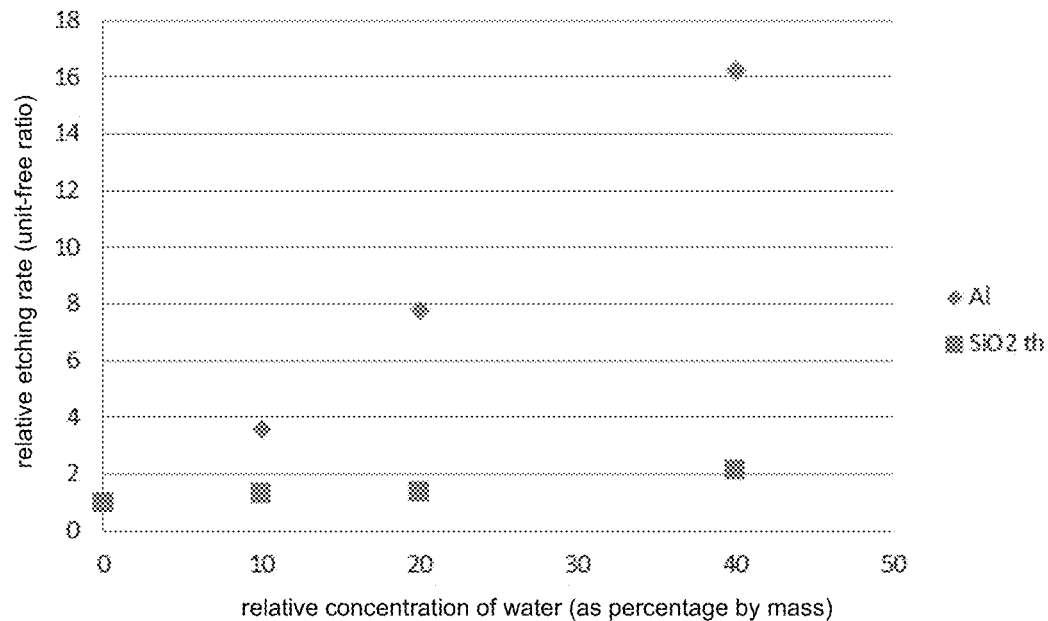
FIG. 1, a graph showing the relative rates of removal of the aluminium and of the thermal oxide of silicon (unit-free ratio) as a function of the water content present (as percentage by mass) in a chemical composition according to one embodiment of the invention comprising acetic acid, methanesulphonic acid, ammonium fluoride and 1.8% by weight of water (point 0 on the abscissa of the graph in FIG. 1).

The cleaning chemical composition of the invention allows a passivation layer of a substrate to be effectively removed selectively in relation to aluminium and copper. In particular it allows a substrate to be cleaned after plasma etching of one or more constituent layers of the substrate.

The chemical composition comprises hydrofluoric acid in a solvent constituted of a weak acid. The hydrofluoric acid enables the metals and semiconductor materials in oxidised form of the passivation layer to be dissolved.

The hydrofluoric acid is advantageously present in the composition with a content of between 0.2% by weight and 2% by weight relative to the weight of the composition. With a content less than 0.2% by weight, dissolution of the oxidised metals and semiconductor materials by the hydrofluoric acid is reduced, which limits the removal of the passivation layer. With a content greater than 2% by weight, the aggressivity of the hydrofluoric acid towards the etched layer of the substrate, in particular towards metals such as aluminium and copper, becomes more significant and difficult to control, and the etched layer is then much less well protected.

The hydrofluoric acid may come from hydrogen fluoride (HF) and/or other known sources of fluorine such as, for example, ammonium salts.

The weak acid is preferably chosen from acetic acid, formic acid and mixtures of these, and is present in the composition with a content between 20% by weight and 95% by weight, preferably between 50% by weight and 80% by weight, relative to the total weight of the composition. The formic acid and the acetic acid allow the hydrofluoric acid and its salts, such as the ammonium salt, to be effectively solvated.

When the weak acid is a mixture of acetic acid and formic acid, their respective contents in the composition are adjusted so that the weak acid content in the composition is as previously described.

The hydrofluoric acid is acidified by a strong non-oxidising acid, preferably chosen from methanesulphonic acid, hydrochloric acid and mixtures of these.

Methanesulphonic acid is preferred due to its physical stability (it has a very low vapour pressure) and its ability to form stable complexes with numerous metals.

The strong non-oxidising acid is advantageously present in the composition with a content of between 5% by weight and 50% by weight, preferably between 15% by weight and 50% by weight, relative to the weight of the chemical composition. A content of less than 5% by weight causes a severe reduction in the protection of the etched layer, in particular of metals such as aluminium and of copper. With a content greater than 50% by weight, the composition becomes more viscous, which significantly reduces the wetting of the substrate by the composition, and thus reduces the effectiveness of the composition in terms of attacking the passivation layer and in terms of protection of the etched layer.

When the non-oxidising strong acid is a mixture of methanesulphonic acid and hydrochloric acid, their respective contents in the composition are adjusted so that the non-oxidising strong acid content in the composition is as previously described.

The methanesulphonic acid has a concentration between 60% and 80% by weight, and the hydrochloric acid has a concentration between 30% and 40% by weight.

The mixtures of acetic acid with methanesulphonic acid, of acetic acid with hydrochloric acid, of formic acid with methanesulphonic acid, and of formic acid with hydrochloric acid within the composition all come within the context of the invention and all allow selective removal of the passivation layer in relation to the etched layer and in particular the metals such as aluminium and copper.

The chemical composition alternatively comprises water in order to facilitate the solution of the hydrofluoric acid in the solvent. Water moreover allows the substrate surface to become hydrated, and thus hydrates the surface of the passivation layer which improves the effectiveness of the composition.

When there is water present in the composition, it is preferable for its content to be less than or equal to 20% by weight relative to the weight of the composition. A content greater than 20% by weight produces the same effects as too high a hydrofluoric acid content, namely that the aggressivity of the hydrofluoric acid towards the etched layer becomes more significant and difficult to control, and the etched layer is consequently much less well protected.

A water content greater than or equal to 2% by weight relative to the weight of the composition moreover allows satisfactory hydration of the substrate to be achieved.

A composition which comprises only a non-oxidising strong acid and hydrofluoric acid, with perhaps water, results in poor wetting of the substrate. This is the case in particular with a composition comprising methanesulphonic acid and hydrofluoric acid, without a weak acid. The present of a weak acid allows satisfactory wetting of the substrate to be achieved in order to allow optimum removal of a passivation layer of the substrate.

A composition comprising acetic acid as a weak acid, methanesulphonic acid as a strong acid, hydrofluoric acid and possibly water allows the substrate to be effectively wetted. Furthermore the combined presence of acetic acid and methanesulphonic acid allow the $[HF_2]^-$ ions responsible for corrosion to be greatly reduced or even eliminated from the reaction medium.

According to the cleaning method of the invention, the chemical composition described above is brought into contact with the passivation layer for a time that is sufficient to allow removal of said substrate passivation layer. To do this, the substrate could, for example, be soaked in a bath of the chemical composition for a predetermined time. The composition attacks the passivation layer selectively in relation to the etched layer. In other words, attack of the etched layer by the composition is negligible in terms of that of the passivation layer.

As has already been described, when the etched layer contains aluminium or copper, the attack on the latter by the composition is only negligible in comparison with that on the passivation layer.

The same is true for crystalline metals and/or crystalline semiconductor materials, possibly oxidised, that the etched layer contains. Their crystalline lattice confers rigidity to their structure, and makes them much more resistant to chemical attack, in particular by hydrofluoric acid and by the composition of the invention in comparison with these same materials with an amorphous structure.

When it is brought into contact with the passivation layer, the chemical composition is advantageously brought to a temperature between 20° C. and 40° C., preferably between 20° C. and 30° C. The kinetics of the reaction of the chemical composition with the passivation layer are thus augmented compared with ambient temperature, which allows the implementation time for the cleaning method to be reduced.

The etched layer in particular comprises one of the following elements: aluminium, copper, titanium, and tantalum.

The passivation layer preferably comprises one or more of the following chemical elements: tantalum, hafnium, and zirconium.

EXAMPLES

I. Influence of Hydrofluoric Acid, Methanesulphonic Acid and Water Contents on the Etching Rate of Aluminium and of Thermal $SiO_2$.

A substrate or "wafer" made of silicon is provided comprising a layer of thermal silicon oxide ($SiO_2$) (the result of annealing at a very high temperature) of thickness 200 Angstrom formed at the surface of the substrate. The substrate is covered with a layer of aluminium (Al) of thickness 550 Angstrom deposited by means of Physical Vapour Deposition (acronym PVD) on the layer of thermal $SiO_2$.

For each of the examples I.1, I.2 and I.3, billets of 2 centimetres by 2 centimetres are cut which are then immersed for a few minutes with gentle stirring in the various compositions. The billets are then removed and then rinsed thoroughly in deionised water for at least one minute, then dried using compressed air.

The etching rates of the aluminium and of the $SiO_2$ are then determined using the following methods:

The etching rate of the aluminium is determined by four point measurement using a Lucas Labs 302 four point measuring device. This known method involves passing an electric current between a first pair of points and measuring an electrical voltage between a second pair of points. It thus allows the electrical resistance of the aluminium layer to be measured before and after the sample is immersed in the composition, and to deduce from this the depth of the layer of aluminium that has been removed. A mean of 5 resistance square values is obtained before and after immersion of the samples in order to determine the depth of the remaining aluminium and to deduce the etching rate from this.

The etching rate of $SiO_2$ is determined using reflectometry using an Ocean Optics reflectometer, the Thin Film NanoCalc Reflectometry model. This known method involves sending a signal into the $SiO_2$ layer then analysing the return signal, in order to deduce the thickness of the layer of $SiO_2$ before and after immersion of the sample in the composition, and to deduce from this the depth of the layer of $SiO_2$ that has been removed. A mean of 5 reflectometry values is obtained before and after immersion of the samples in order to determine the depth of the remaining $SiO_2$.

The etching rates are relative in that they are expressed relative to the reference etching rate obtained with an experimentally chosen reference composition.

I.1. Influence of the Water Content

FIG. 1 shows the relative etching rates of aluminium and of the $SiO_2$ (unit-free ratio) as a function of the amount of water added (as percentage by mass) in a composition initially containing 74% by weight of acetic acid, 23% by weight of methanesulphonic acid (concentration 70%), 1.2% by weight of ammonium fluoride and 1.8% by weight of water (point 0 on the abscissa of the graph in FIG. 1).

It is observed that the addition of water to the composition causes a significant increase in the relative etching rate of the aluminium. Compared to the initial composition, the etching rate of the aluminium is multiplied by 3.5 at 10% water, by 7.8 at 20% water and by 16.2 at 40% water.

The relative etching rate of $SiO_2$ also increases, although to a much lesser extent. It is multiplied by 1.5 at 10% water, 1.7 at 20% water, and 2.2 at 40% water.

Consequently, in order to maintain satisfactory protection of the aluminium and of $SiO_2$ a water content of less than or equal to 20% by weight must be maintained in the composition.

I.2. Influence of the Hydrofluoric Acid Content

Figure 2:
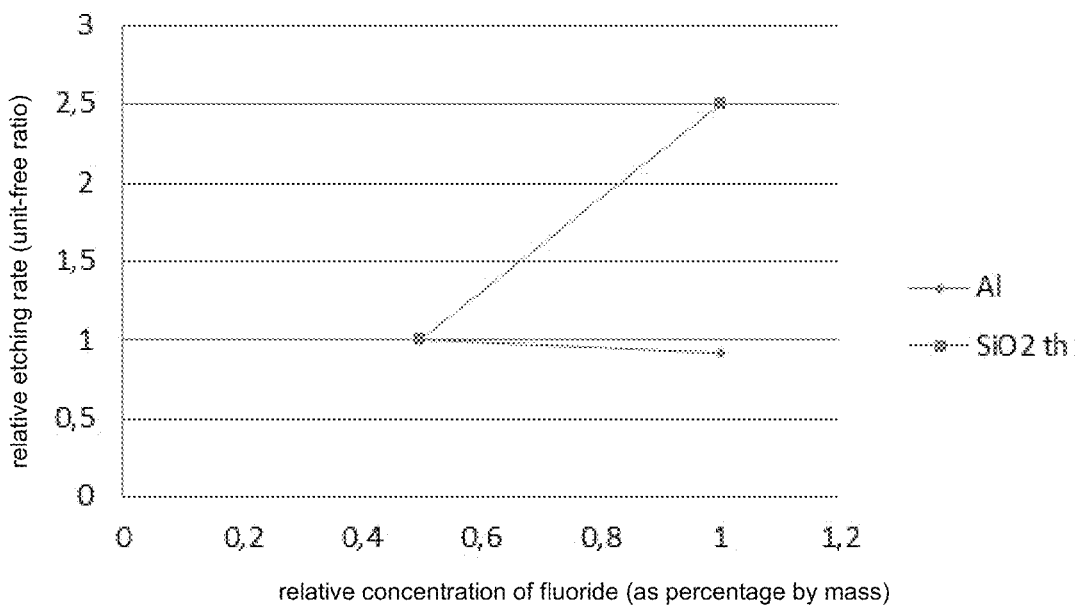
FIG. 2, a graph showing the relative rates of removal of the aluminium and of the thermal oxide of silicon as a function of the fluoride content present (as percentage by mass) in a chemical composition according to one embodiment of the invention comprising acetic acid, methanesulphonic acid, ammonium fluoride and water.

FIG. 2 shows the relative etching rates of aluminium and of $SiO_2$ (unit-free ratio) as a function of the relative fluoride concentration (as percentage by mass) in a composition of acetic acid, methanesulphonic acid and water where the methanesulphonic acid and water contents are fixed at 33% by weight and 9.9% by weight respectively, and where the acetic acid content varies with the fluoride content.

It can be seen that the increase in fluoride causes a sharp increase in the relative etching rate of the $SiO_2$, the latter being multiplied by 2.5 between 0.5% and 1% of hydrofluoric acid.

The increase in fluoride causes a slight decrease in the relative etching rate of the aluminium, the latter being multiplied by 0.9 between 0.5% and 1% hydrofluoric acid.

Consequently, in order to maintain satisfactory protection of the $SiO_2$, a hydrofluoric acid content of less than or equal to 2% by weight must be maintained in the composition.

I.3. Influence of the Methanesulphonic Acid Content

Figure 3:
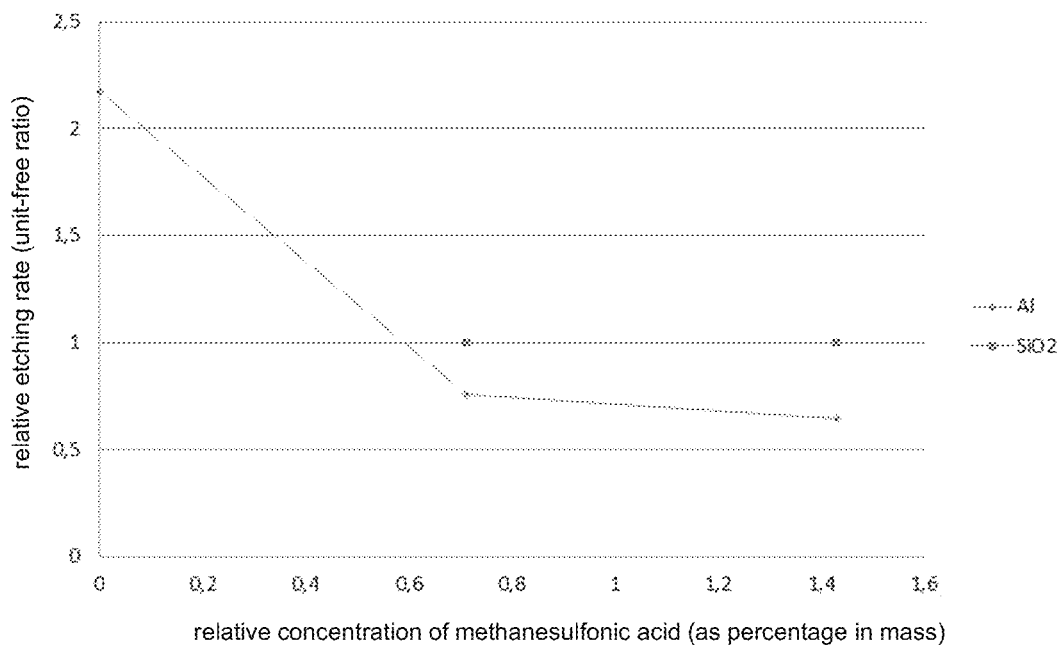
FIGS. 3 and 4, graphs showing the relative rates of removal of the aluminium and of the thermal oxide of silicon (unit-free ratio) as a function of the methanesulphonic acid content present (as percentage by mass) in a chemical composition according to one embodiment of the invention comprising acetic acid, methanesulphonic acid, ammonium fluoride and water, for two different ammonium fluoride contents relative to the methanesulphonic acid.
Figure 4:
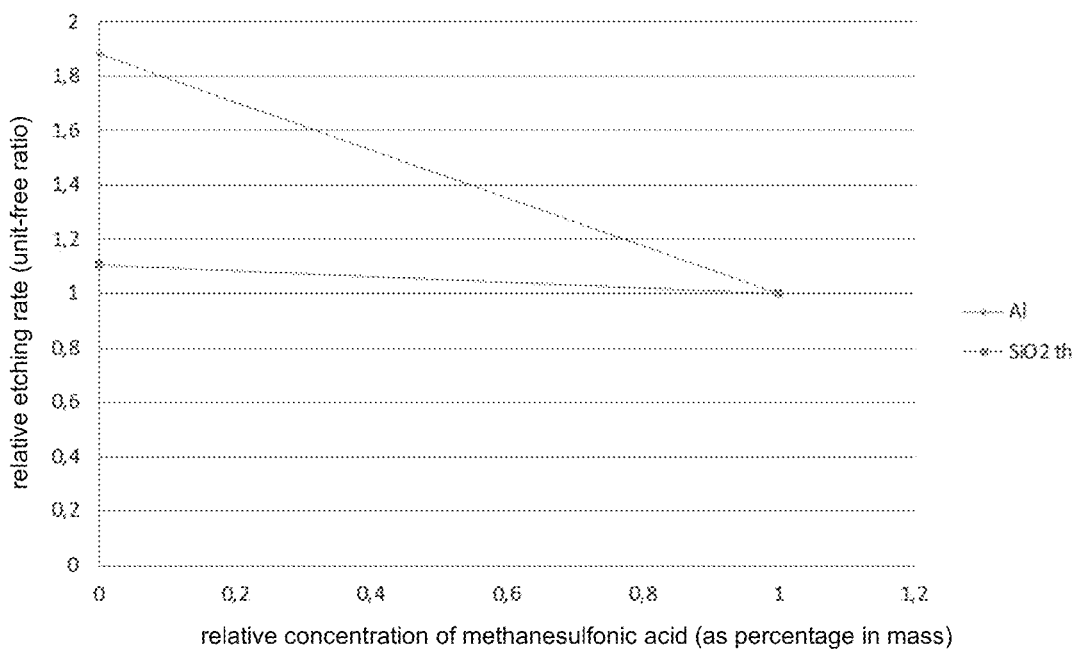

FIGS. 3 and 4 show the relative etching rates of aluminium and of $SiO_2$ (unit-free ratio) as a function of the relative concentration of methanesulphonic acid (as percentage mass) in compositions of acetic acid, hydrofluoric acid and water, where:
- in FIG. 3 the hydrofluoric acid and water contents are fixed at 0.89% by weight and 10% by weight respectively, and the acetic acid content varies with the methanesulphonic acid content;
- in FIG. 4 the hydrofluoric acid and water contents are fixed at 0.65% by weight and 8.7% by weight respectively, and the acetic acid content varies with the methanesulphonic acid content.

In FIG. 3, it can be seen that the increase in methanesulphonic acid up to 0.7% causes a sharp reduction in the relative etching rate of aluminium, the latter changing from a ratio of 2.2 to 0.7 then a smaller reduction up to 1.4% with a ratio of 0.6. As for the relative etching rate of $SiO_2$ it remains substantially constant from 0.7% methanesulphonic acid on.

In FIG. 4, it can be seen that the increase in methanesulphonic acid causes a sharp reduction in the relative etching rate of aluminium, the latter changing from a ratio of 1.9 to 1 between 0% and 1% methanesulphonic acid. The relative etching rate $SiO_2$ decreases slightly and changes from a ratio of 1.1 to 1 between 0% and 1% methanesulphonic acid.

Consequently the addition of methanesulphonic acid can be used to significantly improve the protection of the aluminium.

II.1. Cleaning of an Aluminium Connection Pad After Plasma Etching

Figure 5:
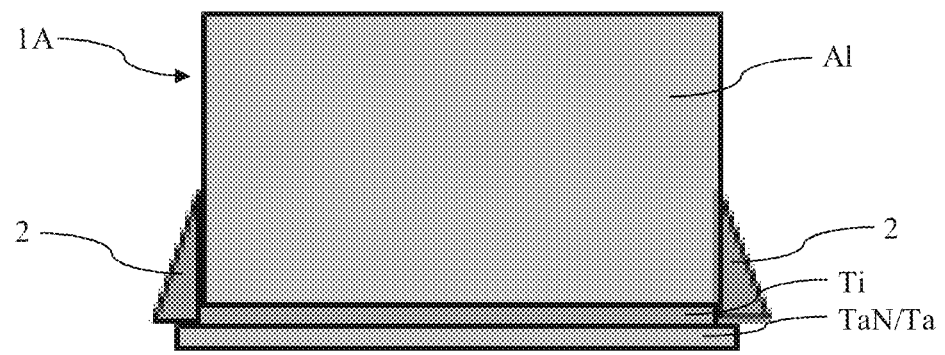
FIG. 5, a diagram of an aluminium "pad" after plasma etching, comprising several layers of material as well as etching residues rich in tantalum on the flanks.

A silicon substrate is provided comprising a stack of layers of materials wherein aluminium connection pads are plasma-etched, one of which pads, 1A, is shown schematically in FIG. 5. In practice such a pad corresponds to a last connection level which rests on many other interconnection levels of the substrate. The dimension of the pad 1A is about 2 micrometres in length×2 micrometres in width at its base. It comprises, successively, a layer of tantalum and of tantalum nitrate (Ta/TaN), a layer of titanium (Ti) and a layer of aluminium (Al) with a thickness of 1 micrometre, deposited by Physical Vapour Deposition (acronym PVD).

The various constituent layers of the pads are etched simultaneously by plasma etching with an etching gas which produces residues 2 on the flanks of the pad. These etching residues 2 are formed from the different elements of the etched layers, and form a passivation layer which reduces the impact of the etching. The chemical composition of the etching residues is as follows: $Ta_wTi_xAl_yO_z$, where w, x, y, z are the stoichiometric indices of the various chemical elements.

2 centimetres×2 centimetre billets are cut from the structure obtained after plasma etching, each comprising a plurality of pads, using a diamond tip.

The aluminium pad billets are immersed in two mixtures with equivalent fluoride concentrations:
- a mixture comprising 1% by weight of hydrofluoric acid in acetic acid,
- a mixture corresponding to the composition according to one embodiment of the invention, comprising 74% by weight of acetic acid, 23% by weight of methanesulphonic acid (concentration 70%), 1.2% by weight of ammonium fluoride, and 1.8% by weight of water.

After immersion for 3 minutes at ambient temperature with gently stirring and drying, the billets are observed under a scanning electron microscope in order to assess the effectiveness of the cleaning.

Figure 6A:
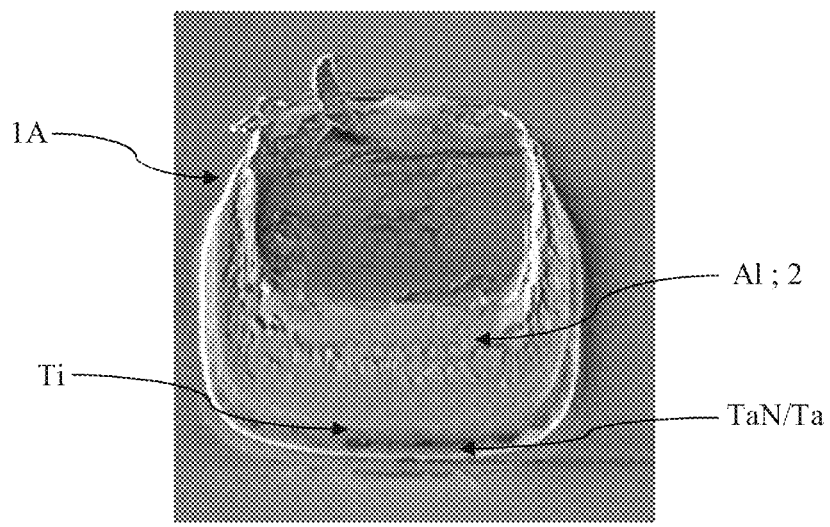
FIGS. 6A, 6B, and 6C, photos from scanning electron microscopy of the aluminium pad in FIG. 5 before and after removal of the etching residues by cleaning with a chemical composition according to one embodiment of the invention.
Figure 6B:
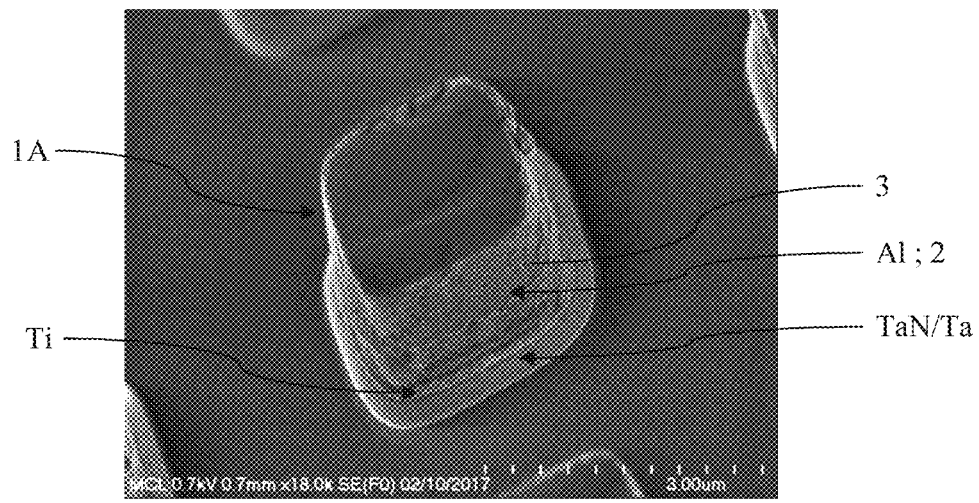
Figure 6C:
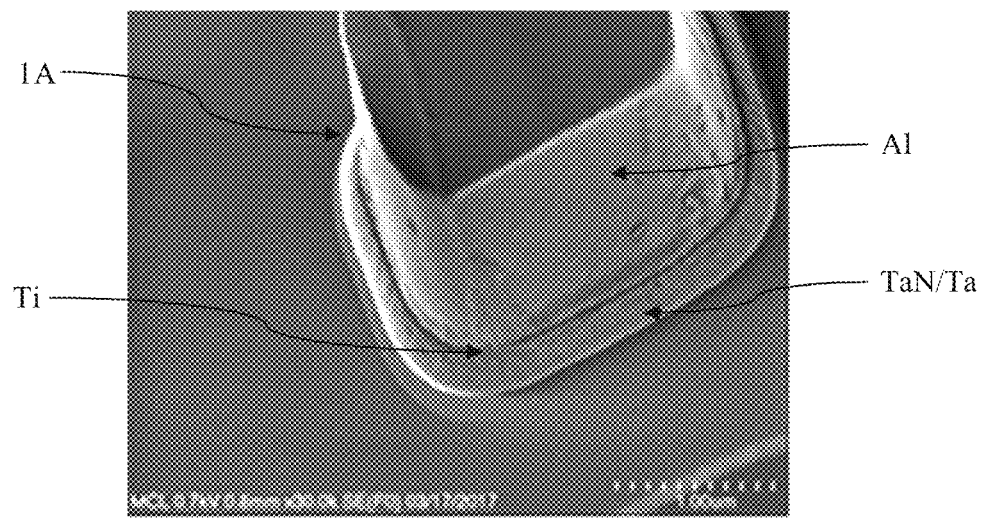

The images obtained are shown in FIGS. 6B and 6C. FIG. 6A acts as a reference and shows a billet before cleaning.

In FIG. 6A, it can be seen that the passivation layer 2, visible because of the surface irregularities that it comprises, covers the flanks of the pad. The portion of passivation layer which covers the lower part of the pad at the Ti and Ta/TaN layers is richer in Ti and Ti, whereas the portion of the passivation layer which covers the upper part of the pad at the Al layers is richer in Al.

In FIG. 6B it can be seen that the passivation layer 2 is still present, which indicates that the mixture is not effective enough. Furthermore, holes 3 in the aluminium in the upper part of the pad indicate localised corrosion of the aluminium (this phenomenon is known as "pitting"), which shows that the mixture is too aggressive towards aluminium.

In FIG. 6C, it can be observed that there is no longer a passivation layer 2, the latter having been entirely removed by the composition of the invention during cleaning. Thus the addition of methanesulphonic acid to a mixture of acetic acid and of hydrofluoric acid greatly increases the effectiveness of the cleaning as well as the protection of the aluminium.

The attack on the layers of Ti and Ta/TaN is negligible, due to their crystalline structure.

The etching rates of the aluminium and of thermal $SiO_2$ have been determined by 4-point measurements and reflectometry in accordance with the protocols whose details were given in example (I), and are equal to 17 Angstrom per minute for the aluminium and 12 Angstrom per minute for the thermal $SiO_2$. This very slight loss is shown by the fact that the morphology of the pad remains visually unchanged.

II.2. Cleaning of a $Ta_2O_5$-Based MIM Capacitor After Plasma Etching

Figure 7:
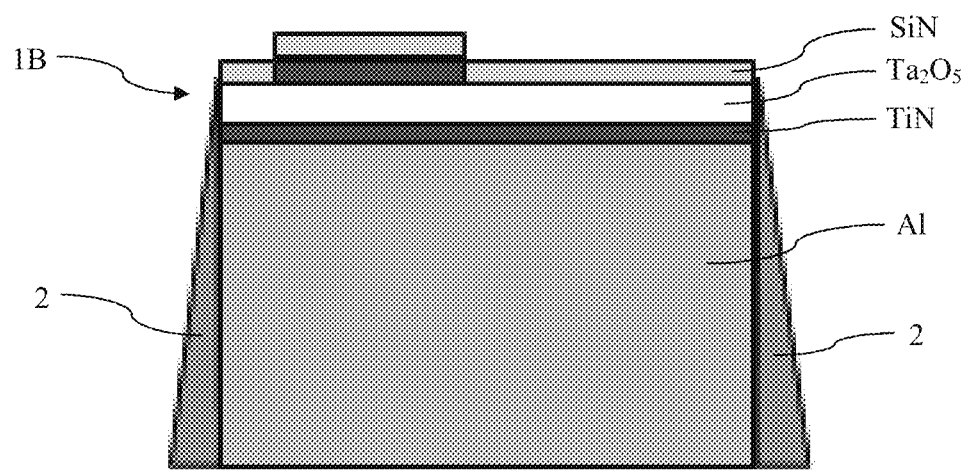
FIG. 7, a diagram of a $Ta_2O_5$— based MIM capacitor after plasma etching, comprising several layers of material as well as etching residues on the flanks.

A substrate is provided comprising a stack of layers of materials wherein MIM capacitors are plasma-etched, one which one MIM capacitor, with reference 1B, is shown schematically in FIG. 7. An MIM capacitor 1B takes the form of a pad, whose dimensions are about 5 micrometres wide×3 micrometres long at its base. It comprises a layer of aluminium (Al) with a thickness of 600 Angstrom deposited by vapour phase physical deposition onto the substrate, surmounted by a layer of titanium nitrate (TiN), a layer of tantalum pentoxide ($Ta_2O_5$) (a high dielectric constant insulating material) arranged on the TiN layer and a layer of silicon nitride (SiN) arranged on the layer of $Ta_2O_5$.

In a manner which is analogous to the aluminium connection pads, the various constituent layers of the MIM capacitors are etched simultaneously by plasma etching with an etching gas which produces residues 2 on the flanks of the MIMs. These etching residues 2 are formed from the different elements of the etched layers, and form a passivation layer which reduces the impact of the etching. The chemical composition of the etching residues is as follows: $Ta_vAl_wTi_yN_xSi_yO_z$, where v, w, x, y, z are the stoichiometric indices of the various chemical elements.

2 centimetres by 2 centimetre billets are cut from the structure obtained after plasma etching, each comprising a plurality of MIMs, using a diamond tip.

The MIM billets are immersed in the composition according to one embodiment of the invention, whose constituents and their contents are identical to the composition used in example II.A for aluminium pads. The composition comprises 74% by weight of acetic acid, 23% by weight of methanesulphonic acid (concentration 70%), 1.2% by weight of ammonium fluoride, and 1.8% by weight of water.

After immersion for 3 minutes at ambient temperature with gentle stirring and drying, the billets are observed under a scanning electron microscope in order to assess the effectiveness of the cleaning.

Figure 8A:
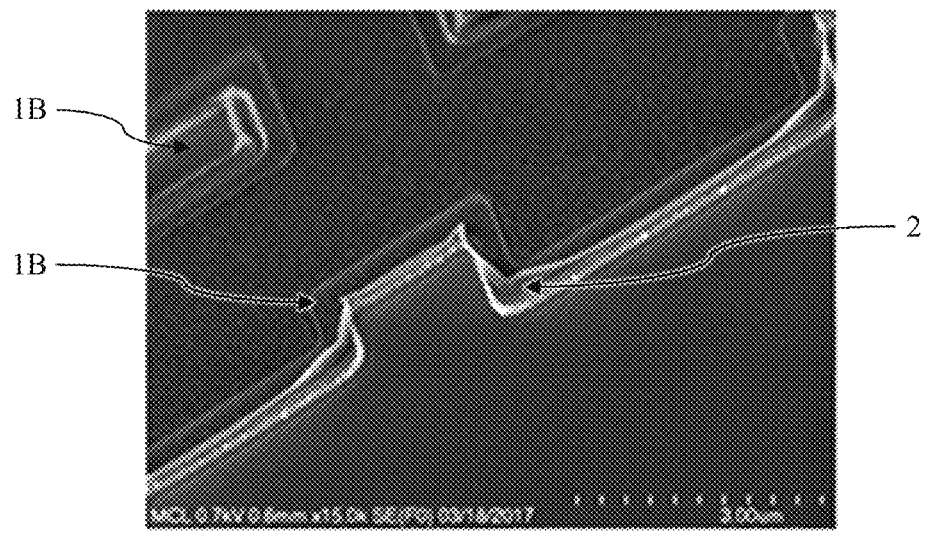
FIGS. 8A, 8B, and 8C, photos from transmission and scanning electron microscopy of the MIM capacitor in FIG. 7 before and after removal of the etching residues by cleaning with a chemical composition according to one embodiment of the invention.
Figure 8B:
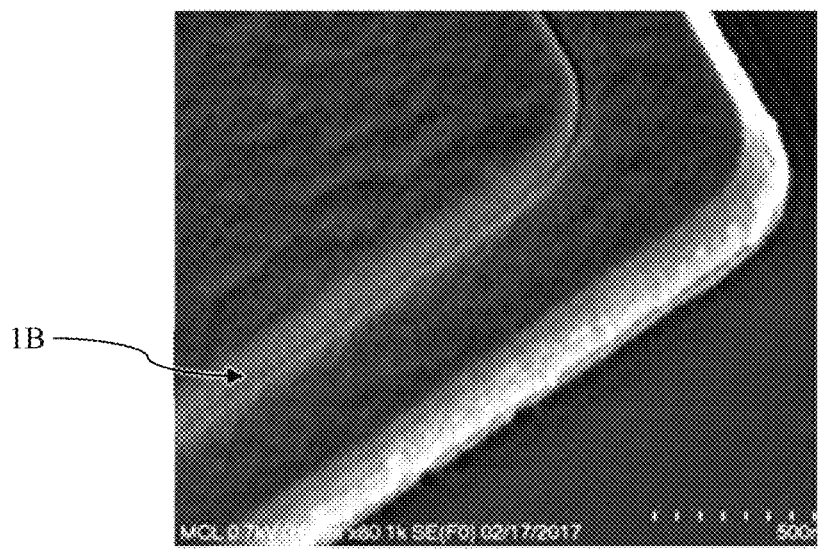

The image obtained is shown in FIG. 8B. FIG. 8A acts as a reference and shows a billet before cleaning.

It can be seen in FIG. 8A that the passivation layer 2, visible in the form of a clear film, covers the flanks of the MIM capacitor over their entire length.

In FIG. 8B, it can be observed that there is no longer a passivation layer 2, the latter having been entirely removed by the composition of the invention during cleaning. There is moreover no visible sign of attack on the aluminium.

Figure 8C:
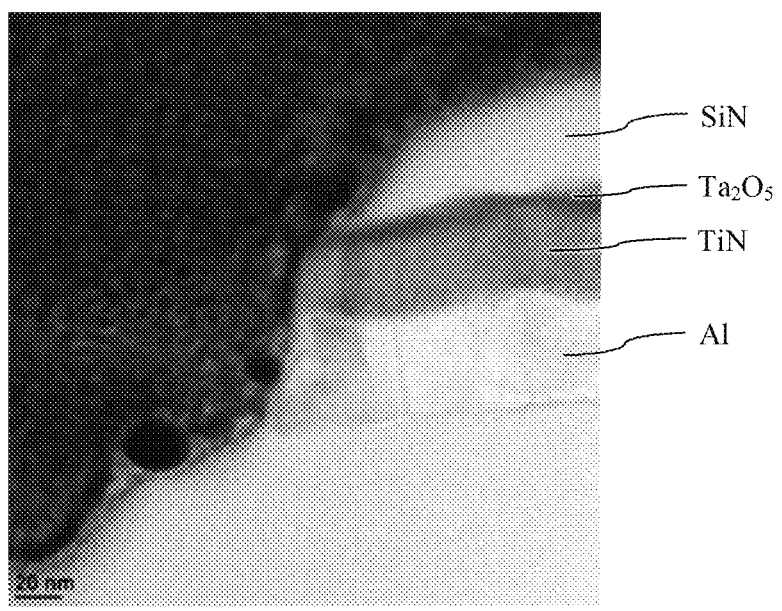

FIG. 8C shows a billet observed using transmission electron microscopy with Focussed Ion Beam (FIB) probe, at the nanometre scale. No shrinkage of either the aluminium or of the TiN and $Ta_2O_5$, and only a very slight shrinkage of the SiN is observed.

The composition has therefore attacked and caused the removal of the passivation layer which selectively in relation to the aluminium. The attack on the layers of TiN, $Ta_2O_5$, and SiN is negligible, due to their crystalline structure.

Replacement of the layer of $Ta_2O_5$ by the high dielectric constant materials hafnium dioxide ($HfO_2$) and zirconium dioxide ($ZrO_2$) give the same result, namely that a corresponding layer of $HfO_2$ or of $ZrO_2$ within the present MIM structure is not attacked by the composition of the invention.

The etching rate of aluminium has been determined by 4-point measurement in accordance with the protocol details which were given in example (I), and is equal to 17 Angstrom per minute. This very slight loss is shown by the fact that the morphology of the pad remains visually unchanged.

III. Cleaning of a Well After Plasma Etching

Figure 9:
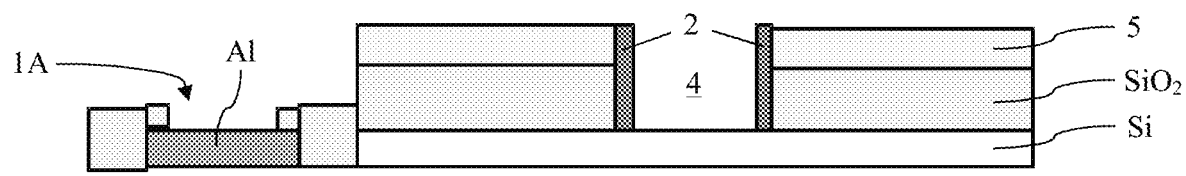
FIG. 9, a diagram of a silicon oxide substrate after plasma etching, wherein the lateral wall of a well is covered by etching residues.

A substrate made of silicon (Si) is provided comprising a layer of $SiO_2$ of about 3 micrometres thickness covered with a photoresin 5 serving as an etch mask, in order to selectively remove a portion of the $SiO_2$ layer. The structure is shown schematically in FIG. 9. The plasma etching of $SiO_2$ has resulted in the formation of a passivation layer 2 on the lateral wall of the etching well 4.

The composition of the etching gas is: $C_xF_y$, where x and y are stoichiometric indices of the various chemical elements.

The composition of the etching residues 2 forming the passivation layer is: $Si_wAl_xO_yF_z$, where w, x, y and z are the stoichiometric indices of the various chemical elements.

Cleaning of the above structure is performed in order to remove the well passivation layer, with a chemical composition comprising 58.8% by weight of acetic acid, 40% by weight of methanesulphonic acid (concentration 70%), and 1.2% by of weight ammonium fluoride.

Connection pads 1A made of aluminium are connected to the above structure, and are exposed to the composition during cleaning. It is necessary, therefore, to remove the passivation layer 2 from the well 4 without attacking the aluminium of the pad.

2 centimetres by 2 centimetre billets are cut from the structure, and are immersed in the composition.

After immersion for 2 minutes at ambient temperature with gentle stirring and drying, the resin 5 is removed with an inert solution of inorganic compounds, and the billets are observed using a scanning electron microscope in order to assess the effectiveness of the cleaning.

Figure 10A:
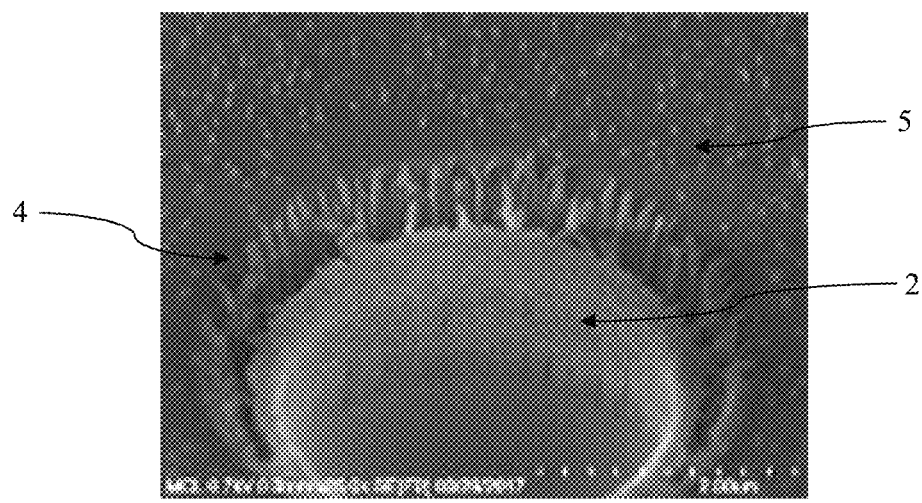
FIGS. 10A, 10B, and 10C, photos from scanning electron microscopy of the substrate in FIG. 9 before and after removal of the etching residues by cleaning with a chemical composition according to one embodiment of the invention.
Figure 10B:
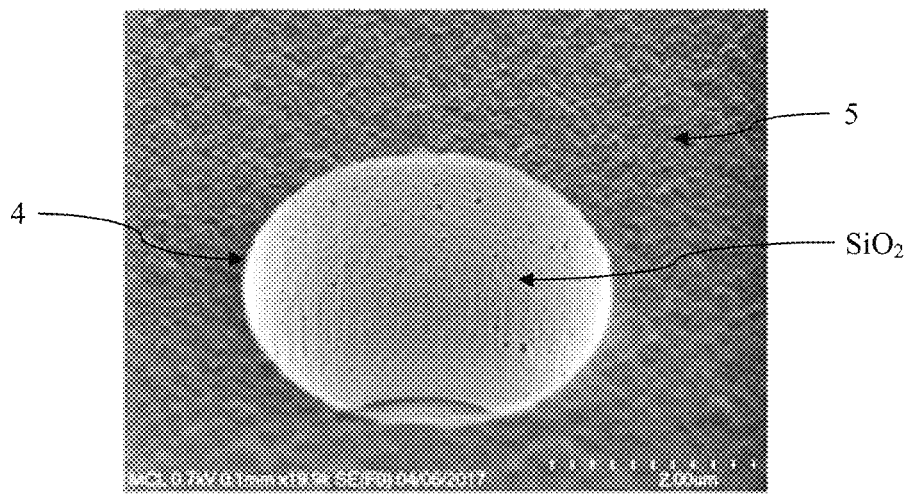
Figure 10C:
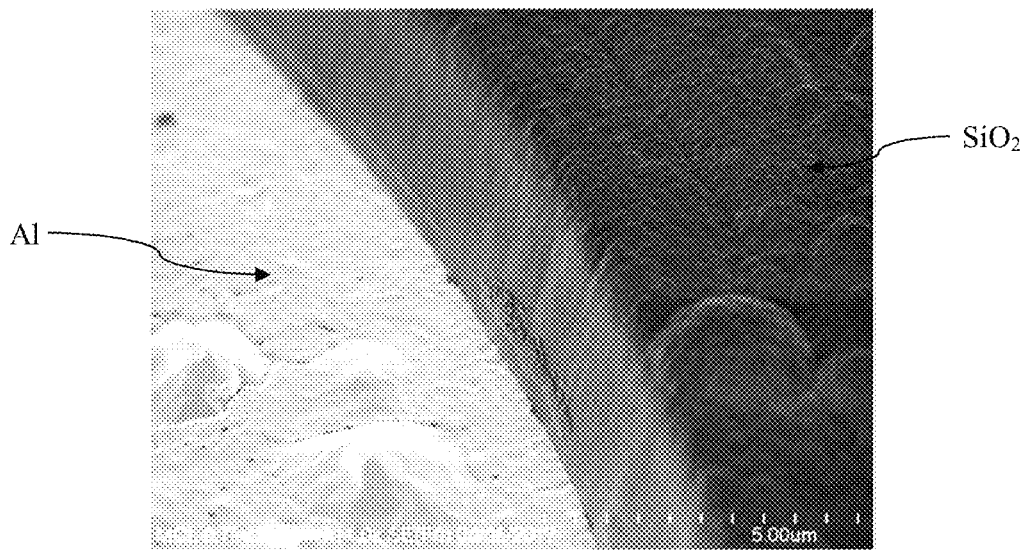

The images obtained are shown in FIGS. 10B and 10C. FIG. 10A acts as a reference and shows a billet before cleaning.

In FIG. 10A it can be seen that the passivation layer 2 covers the lateral wall of the well 4. It covers the lateral wall of $SiO_2$ and the lateral wall of the super-jacent resin.

In FIG. 10B, after removal of the resin 5 it can be observed that there is no longer a passivation layer 2 on the lateral surface of $SiO_2$, the latter having been entirely removed by the composition of the invention during cleaning. There is moreover no visible sign of attack on the $SiO_2$.

FIG. 10C is centred on the pad 1A made of aluminium. It can be seen that there is no visible sign of attack on the aluminium.

The etching rates of the aluminium (pad 1A) and of $SiO_2$ (well 4) were determined by 4-point measurement and reflectometry in accordance with the protocols whose details were given in example (I) and are, respectively, equal to 12 Angstrom per minute for aluminium and 10 Angstrom per minute for $SiO_2$, hence a removal of a depth of aluminium of about 24 Angstrom, that is 0.0024 micrometres, and of a depth of $SiO_2$ of 20 Angstrom, or 0.0020 micrometres, in 2 minutes. This very slight loss is shown by the fact that the morphology of the pad and of the well remains visually unchanged.

REFERENCES

US2016/0163533

The invention claimed is:

1. A cleaning chemical composition suitable for removing, from a substrate, a passivation layer comprising etching residues resulting from etching of said substrate, said cleaning chemical composition comprising:
  a weak acid chosen from acetic acid and a mix of acetic acid and formic acid, the weak acid content being between 20% by weight and 95% by weight relative to the weight of the chemical composition,
  a non-oxidising strong acid chosen from methanesulphonic acid and a mix of methanesulphonic acid and hydrochloric acid, the strong non-oxidising acid content being between 5% by weight and 50% by weight relative to the weight of the chemical composition, hydrofluoric acid, whose content is between 0.2% by weight and 2% by weight relative to the weight of the chemical composition, water, whose content is between 2% by weight and 20% by weight relative to the weight of the chemical composition.

2. The chemical composition of claim 1 wherein the strong acid is the mix of methanesulphonic acid and hydrochloric acid.

3. The chemical composition of claim 1 wherein the strong non-oxidising acid content is between 15% by weight and 50% by weight relative to the weight of the chemical composition.

4. The chemical composition of claim 1 wherein methanesulphonic acid has a concentration of between 60% by weight and 80% by weight.

5. The chemical composition of claim 1 wherein hydrochloric acid has a concentration of between 30% by weight and 40% by weight.

6. A cleaning method for removing, from a substrate, a passivation layer comprising etching residues resulting from etching of said substrate, said cleaning method comprising the following steps:

providing a cleaning chemical composition according to claim 1, bringing the cleaning chemical composition into contact with the passivation layer for a time that is sufficient to remove said passivation layer from the substrate.

7. The method of claim 6, wherein the cleaning chemical composition is manufactured from methanesulphonic acid which has a concentration of between 60% by weight and 80% by weight.

8. The method of claim 6, wherein the cleaning chemical composition is manufactured from hydrochloric acid which has a concentration of between 30% by weight and 40% by weight.

9. The method of claim 6 comprising, prior to the contact step, a step for plasma etching of a layer or of a stack of layers of a substrate from which the passivation layer results by the interaction of plasma ions with the layer or at least one of the layers of the stack of layers of the substrate.

10. The method of claim 9 wherein the constituent materials of the etched layer or of the stack of etched layers of the substrate are chosen from one or more of the following materials: metals, metallic oxides, semiconductor materials, oxides of semiconductor materials.

11. The method of claim 9 wherein the constituent materials of the etched layer or of the stack of etched layers of the substrate comprise aluminium and/or copper.

12. The method of claim 6, wherein during the period it is in contact with the passivation layer, the chemical composition is at a temperature of between 20° C. and 40° C., preferably between 20° C. and 30° C.

13. The method of claim 6, wherein the passivation layer comprises one or more of the following chemical elements: Tantalum, hafnium, zirconium.

* * * * *